United States Patent [19]
Yamazaki et al.

[11] Patent Number: 5,319,231
[45] Date of Patent: Jun. 7, 1994

[54] INSULATED GATE SEMICONDUCTOR DEVICE HAVING AN ELEVATED PLATEAU LIKE PORTION

[75] Inventors: Shunpei Yamazaki, Tokyo; Yasuhiko Takemura; Norihiko Seo, both of Kanagawa, all of Japan

[73] Assignee: Semiconductor Energy Laboratory Co., Ltd., Kanagawa, Japan

[21] Appl. No.: 819,964

[22] Filed: Jan. 13, 1992

[30] Foreign Application Priority Data

Jan. 11, 1991 [JP] Japan ............... 3-069561

[51] Int. Cl.⁵ .............. H01L 29/76; H01L 27/01; H01L 29/94; H01L 31/062
[52] U.S. Cl. .................. 257/344; 257/347; 257/408; 257/409
[58] Field of Search ............... 257/344, 408, 409, 347

[56] References Cited

U.S. PATENT DOCUMENTS

| | | | |
|---|---|---|---|
| 4,954,855 | 9/1990 | Mimura et al. | 257/347 |
| 5,041,885 | 8/1991 | Gualandris et al. | 257/344 |
| 5,049,953 | 9/1991 | Mihara et al. | 257/409 |
| 5,177,568 | 1/1993 | Honma et al. | 257/408 |

FOREIGN PATENT DOCUMENTS

| | | | |
|---|---|---|---|
| 61-255069 | 11/1986 | Japan | 257/344 |
| 62-217665 | 9/1987 | Japan | 257/344 |
| 53-292678 | 11/1988 | Japan | 257/344 |
| 63-296278 | 12/1988 | Japan | 257/344 |
| 1-49266 | 2/1989 | Japan | 257/344 |

*Primary Examiner*—Rolf Hille
*Assistant Examiner*—Steven Loke
*Attorney, Agent, or Firm*—Sixbey, Friedman, Leedom & Ferguson

[57] ABSTRACT

An insulated gate device has a substrate with a surface protrusion bearing a gate electrode. A conductive substance is provided on a side of the protrusion and on the substrate, with a height not above the upper surface of the protrusion. The conductive substance may be a metallic material or a semiconductive material, and functions as source and/or drain regions for a channel region formed in a protrusion under the gate electrode. Also, the conductive substance may contact the side surface of the protrusion either directly, or indirectly through an insulating layer capable of passing tunnel current.

13 Claims, 12 Drawing Sheets

F I G. 14 (A)
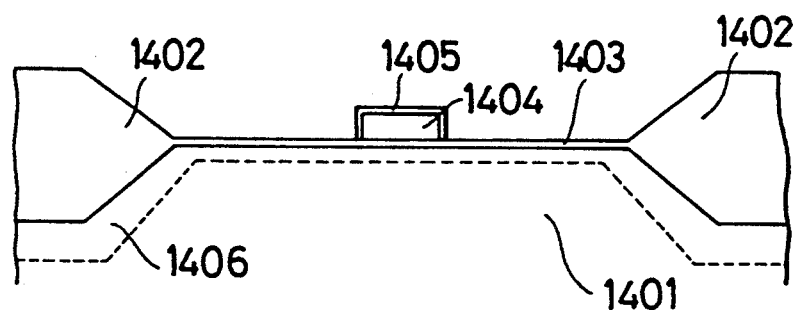
F I G. 14 (B)
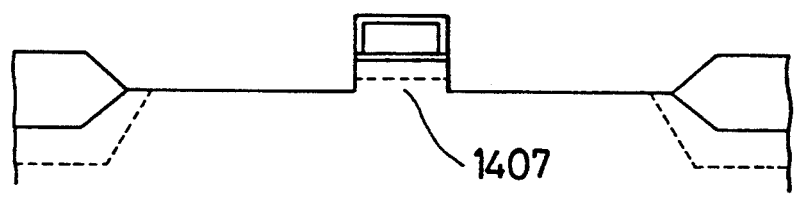
F I G. 14 (C)
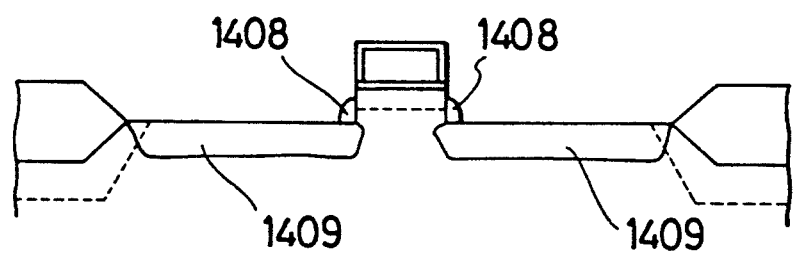
F I G. 14 (D)
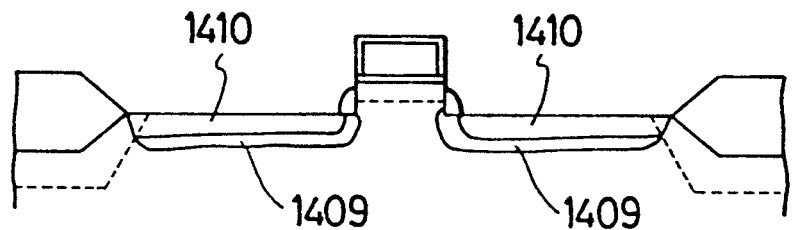

F I G. 15 (A)
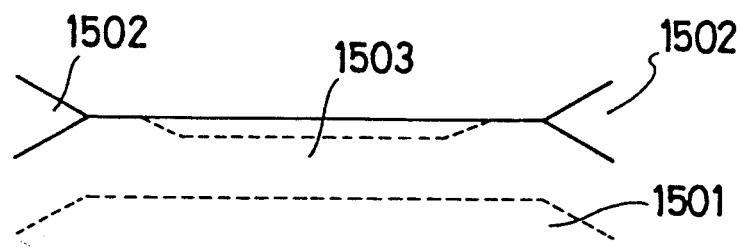
F I G. 15 (B)
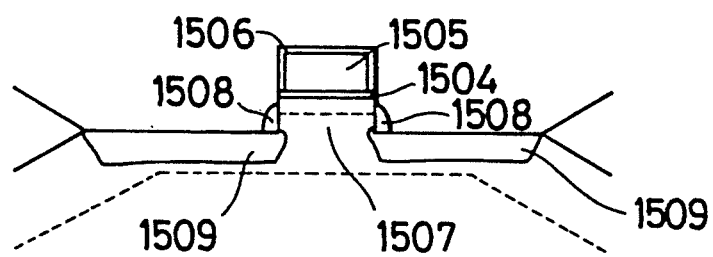
F I G. 15 (C)
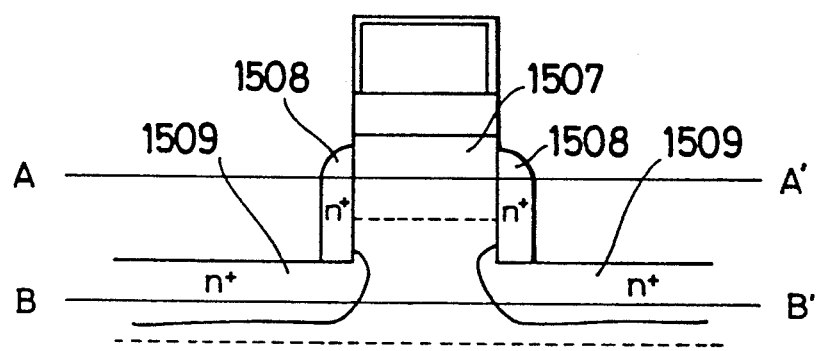
F I G. 15 (D)
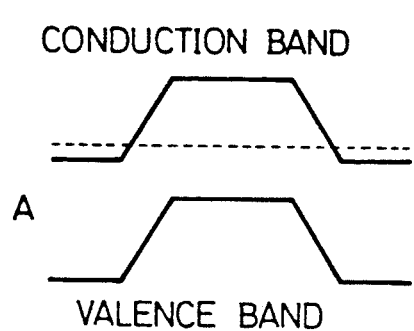
F I G. 15 (E)
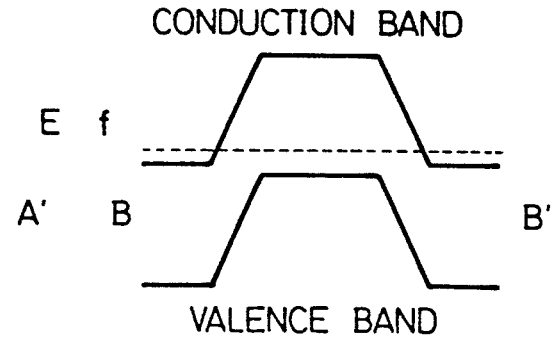

INSULATED GATE SEMICONDUCTOR DEVICE HAVING AN ELEVATED PLATEAU LIKE PORTION

BACKGROUND OF THE INVENTION

1. Field of the Invention

The present invention relates to a micro-semiconductor device and an integrated circuit using the same. The present invention also relates to a process for producing a micro-semiconductor device.

2. Description of the Prior Art

So-called MOS (metal-oxide-semiconductor) and MIS (metal-insulator-semiconductor) field effect transistors (collectively referred to hereinafter as MISFETs) are the essential devices for integrated circuits (ICs), large scale integrated circuits (LSIs), and very-large scale integrated circuits (VLSIs). More advanced MISFETs are now developed with progress in the development of finer and faster devices.

An LDD(lightly doped drain)-type MISFET is known as the most advanced MISFET at the present. A schematically drawn structure of this device is given in FIG. 1. A MISFET of this structure is characterized by that the impurity region provided on the substrate, such as the source and the drain, has a continuously changing concentration, since there is no large electric field generated at the phase boundary between the impurity region and the channel region. Referring to FIG. 1, for example; areas changed in the conductive type are established, from a source electrode 107 to an n+-type first source 102, then to an n--type second source 103, a p--type channel 108, followed by an n--type second drain 104, an n--type first drain 105, and finally to a drain electrode 106. Thus, because of a moderate gradient in the electric field at the boundary between the channel region and the impurity region, defects due to over-acceleration of the carriers at this region are less produced on the semiconductors and the gate insulator films. The LDD-type MISFETs are therefore endurable for use over a long period of time.

In a typical LDD-type MISFET as illustrated in FIG. 1, however, several problems arise with increasing fineness of the devices. Representatively, there can be mentioned an overlap of the impurity region and the gate electrode, and a concentration of the electric field between the impurity regions right below the gate insulator film. The former concerns the process. In general, the impurity region is established by ion-implantation, i.e., by bombarding the substrate with impurity ions in a self-consistent manner using the gate electrode as the mask. Ideally, there should be no overlap between the gate electrode and the impurity region, however, in practice, the impurity ions go beyond the desired region to the portion under the gate electrode. The reason for such overlapping is considered mainly due to the incident impurity ion beams which undergo a secondary scattering upon irradiation on the crystal lattices of the semiconductor substrate. This phenomena is more enhanced with increasing energy of the incident ion beam energy, and more pronounced with relative decrease in the gate width, i.e., the channel length. An overlap of the impurity region and the electrode impairs the speed of the MISFET due to the increased parasitic capacity between the gate electrode and the impurity region.

The latter of the aforementioned problems is also a serious problem in the case of a typical LDD-type MISFET. Referring to the MISFET as shown in FIG. 1, which comprises an impurity region of the structure as illustrated, the electric field become most concentrated between the points A and B at the ends of the second source region and of the second drain regions, respectively, upon application of a voltage between the source and the drain. Accordingly, the most accelerated carriers run between the two points, A and B; hence. the gate insulator films are liable to be damaged since those points are located right under them. The gate insulator film thus damaged by the accelerated carriers generates charge trap centers, and, in an extreme case, the gate electrode completely loses the ability to control the carrier passing through the channel region.

As a measure to overcome the aforementioned problems, an LDD-type MISFET as shown in FIG. 2 (a) has been proposed. The very difference between this MISFET and the conventional LDD-type MISFET of the structure given in FIG. 1 is that the points A and B, which are the end points of the second source region and the second drain region, respectively, are located remotely from the gate insulator films. Thus, the gate insulator films are less damaged by the concentration of the electric field to these two points. Furthermore, because of the electrode established distant from the impurity region, as it can be seen clearly from FIG. 2(a), the parasitic capacity can be reduced despite of the overlapping of the electrode and the impurity region.

The LDD-type MISFETs of this structure can be fabricated by bombarding impurity ions from an oblique direction with respect to the surface. However, an MISFET with a channel length of 0.5 μm or less cannot be expected with a high yield because of the difficulty encountered in its fabrication process. More specifically, such structures can be fabricated with good reproducibility only when the accelerating energy of the impurity ions are controlled with high precision and when a highly ordered ion source is available. If those requirements are not sufficiently achieved at the fabrication process, the oblique incident ion beams enter into an unexpectedly deep region to result in a fused impurity region, as is shown in FIG. 2(b). This phenomena become more pronounced with minimizing the channel length.

In conclusion, it is industrially unfeasible to adapt the conventional LDD-type MISFETs, inclusive of the modified type as shown in FIG. 2, to MISFETs having a channel length of 0.5 μm or less, particularly to the so-called quarter-micrometer MISFETs having a channel length of 0.3 μm or less.

SUMMARY OF THE INVENTION

An object of the present invention is to provide a practically feasible MISFET having an extremely minimized channel length which has not been heretofore achieved by conventional processes. Another object of the present invention is to provide an industrial process which enables mass production of said MISFET. That is, the present invention provides a MISFET having a channel as short as 0.5 μm or less, having a structure which is capable of reducing the damage on the insulator film ascribed to the accelerated carriers to a degree as low as possible, while also minimizing the parasitic capacity due to the overlap of the gate electrode with the impurity region.

These and other objects of the present invention (i.e., lowering both the damage of the gate insulator film and the parasitic capacity) have been attained by a technological concept illustrated in FIGS. 3(a) and 3(b). Basically, making reference to FIG. 3(a), there is provided an insulated gate semiconductor device according to the present invention characterized by that it comprises a semiconductor substrate 301 having a partially elevated plateau-like portion 302; a gate electrode 303 having substantially the same shape as said plateau-like portion being superposed on said plateau-like portion; a triangular or a rectangular region 304, which functions as a source or a drain, made of a metal or a semiconductor which is in contact with the substrate either tightly or having an insulator incorporated therebetween to such a degree that a tunnel current may generate, being accompanied by said plateau-like portion on the sides thereof; provided that said region 304 comprises the part in contact with the plateau-like portion of the substrate either directly or with an insulator film being incorporated therebetween, with the upper surface of said part provided at a height substantially not higher than the upper surface of the elevated substrate. Preferably, the difference between the height of said region 304 and that of the elevated portion of the substrate is half or less, more preferably, one-tenth or less of the channel length (i.e., the width of the elevated plateau-like portion). In a structure as shown in FIG. 3(a), it can be easily seen that the gate insulator film can be isolated from the carrier path, and hence the film can be protected from the damage ascribed to the carriers accelerated in the concentrated electric field. Furthermore, clearly, such a structure avoids unwanted extension of the drain and the source under the gate electrode and hence reduces the parasitic capacity ascribed to the overlap of the gate electrode and the impurity region.

The region 304 provided on the side of the plateau-like portion of the substrate can be, as mentioned above, a semiconductor or a metal. Furthermore, it may be provided on the substrate either in contact therewith or with a proper insulator incorporated therebetween. The case in which the region 304 is established with a semiconductor is described hereinbelow. The insulator incorporated between the semiconductor and the substrate has, though depending on which insulator to use, an additional effect of avoiding the diffusion of the impurities into the elevated portion of the substrate which becomes a channel. In the case a silicon nitride film is used as the insulator, the film even at a thickness of a several nanometers avoids diffusion of the impurities used commonly in semiconductors. In using silicon oxide as the insulator, the impurities such as phosphorus and boron included in the semiconductor are taken into silicon oxide to give a phosphosilicate glass and a borosilicate glass, respectively.

When the insulator does not function as a shield for preventing the diffusion of the impurities, or when the semiconductor is directly brought into contact with the substrate with no insulator being incorporated, on the other hand, the impurity region 305 having a characteristic structure as shown in FIG. 3(b) can be provided. In this case again, the parasitic capacity can be reduced and the gate insulator film can be protected as well, as in the structure shown in FIG. 3(a), since the drain is provided distant from the gate insulator film.

In FIG. 3 is given the basic structure of the insulated gate semiconductor device according to the present invention. Greater effects can be obtained, however, by modifying this basic structure. Referring to FIG. 4, for example, there is shown a structure in which portion 405 having increased in electric conductivity is provided on the semiconductor substrate located under the electrically conductive portion 404 which is established on the side of the plateau-like portion 402. In the basic structure shown in FIG. 3, the resistance of the source and the drain is determined solely by the electrically conductive region 304. However, the thickness of this electrically conductive region depends on the height of the plateau-like portion 302, which is generally 500 nm or less, and 300 nm or less in the case of a MISFET with a shorter channel length. This signifies that the resistance of this electrically conductive region is very large. Thus, it is possible to reduce the resistance in both the source and the drain by providing an impurity region parallel to the electrically conductive region. Another point to consider is how to establish the electrodes, because it is technologically unfeasible in the present fabrication process to largely increase the width of the electrically conductive region, which is about the same as the height thereof. As can be seen in FIG. 4, however, it is possible to obtain the drain and the source by establishing electrodes 407 on the impurity regions 405 having provided on the substrate 401. When the electrically conductive region 402 is provided with the same semiconductor of the substrate, the conductive type (the impurity concentration) of said semiconductor and the impurity region 405 may be of the same concentration or differed. Furthermore, the impurity used for the semiconductor and the impurity region may be the same or differed. The impurity concentration may have a distribution in the impurity region 405, as is described hereinafter.

The basic structure according to the present invention, as illustrated in FIG. 3, may be developed into a structure as shown in FIG. 5 by combining with a conventional technological concept of an LDD-type MISFET. Making reference to FIG. 5, this type of MISFET comprises a source and a drain composed of, for example, an $n^-$ semiconductor 504 established on the side of the plateau-like portion formed on a substrate, an $n^+$-type impurity region 506 provided right under said semiconductor 504, and an $n^-$-conductive semiconductor region 505. The same impurity may be incorporated to the impurity regions and the semiconductor regions, or there may be incorporated different impurities. Furthermore, a PMOS of a similar structure can be readily fabricated analogously to the NMOS illustrated by FIG. 5.

BRIEF DESCRIPTION OF THE DRAWINGS

FIGS. 14(a)–14(d) shows schematically a fabrication process of a MISFET according to another embodiment of the present invention;

FIGS. 15(a)–15(b) shows schematically a fabrication process of a MISFET according to another embodiment of the present invention;

FIG. 15(c) is an enlarged view of the portion at the vicinity of the gate electrode of the MISFET of FIG. 15(b);

FIG. 15(d) is the energy band profile along the line A—A' of FIG. 15(c); and

FIG. 15(e) is the energy band profile along the line B—B' of FIG. 15(c).

DETAILED DESCRIPTION OF THE PREFERRED EMBODIMENTS

The MISFETs according to the present invention as described hereinbefore can be fabricated by processes as follows.

Process 1

Figure 1:
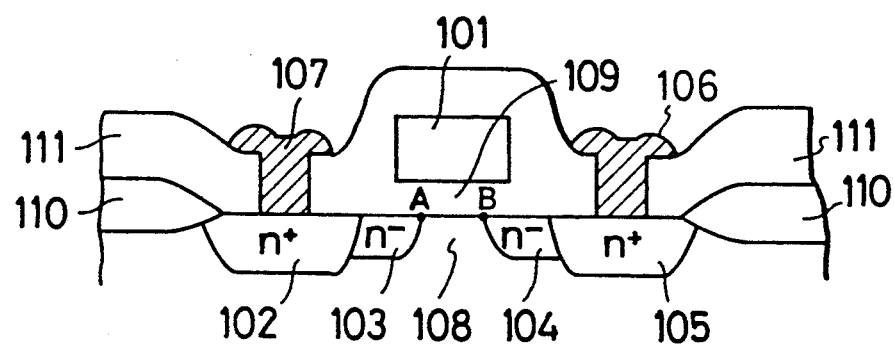
FIG. 1 is a cross sectional view of the structure of a conventional LDD-type MISFET.
Figure 2A:
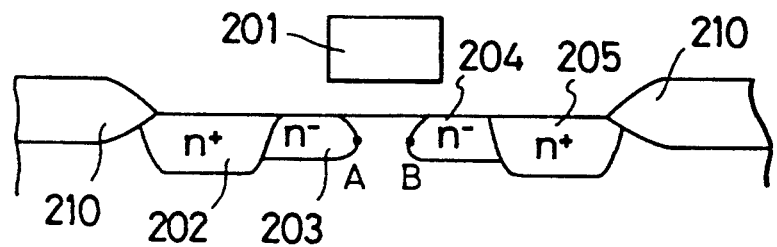
FIG. 2(a) is a cross sectional view of the structure of a conventional LDD-type MISFET, which is a modification of that shown in FIG. 1.
Figure 2B:
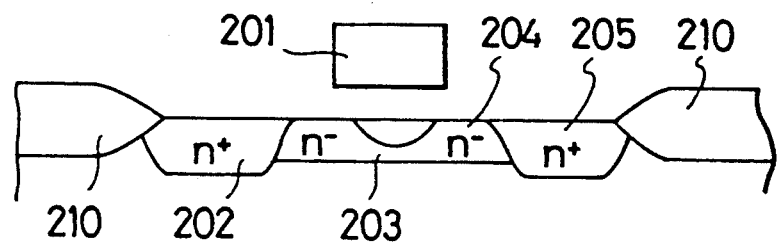
FIG. 2(b) is a cross-sectional view of the structure of a LDD-type MISFET fabricated by bombarding impurity ions from an oblique direction with respect to the surface.
Figure 3A:
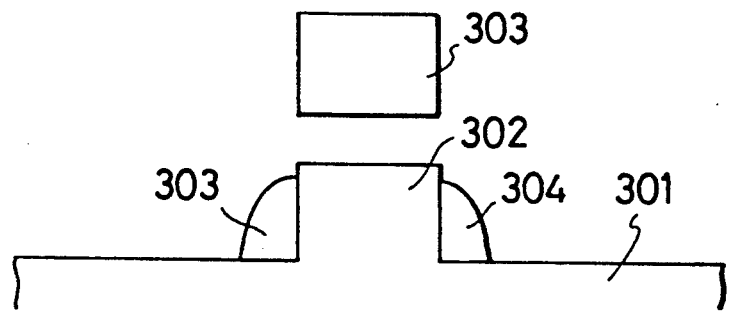
FIG. 3(a) is a cross sectional view of the structure of a MISFET according to an embodiment of the present invention.
Figure 3B:
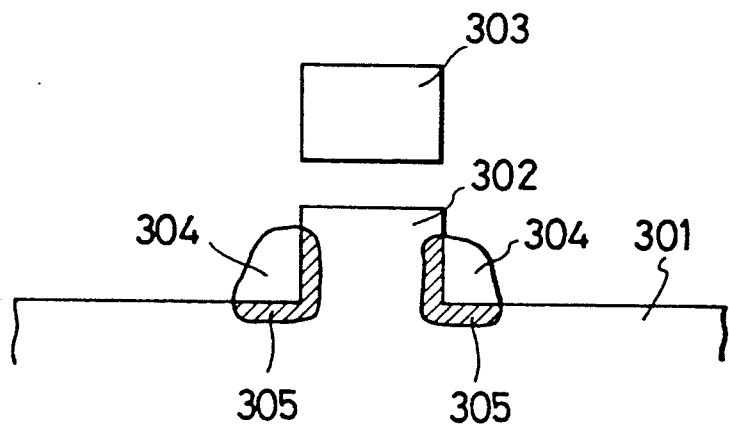
FIG. 3(b) is a cross-sectional view of the structure of a MISFET according to another embodiment of the present invention.
Figure 4:
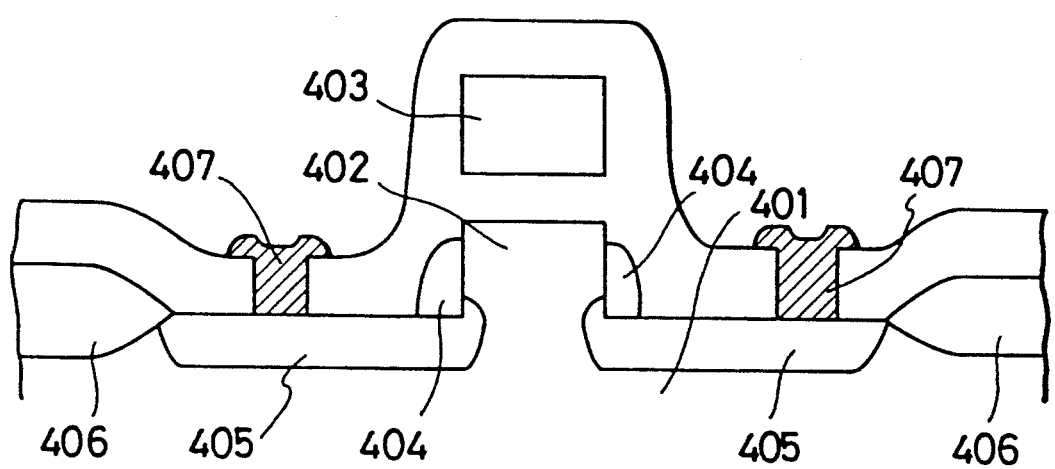
FIG. 4 is a cross sectional view of the structure of a MISFET according to another embodiment of the present invention.
Figure 5:
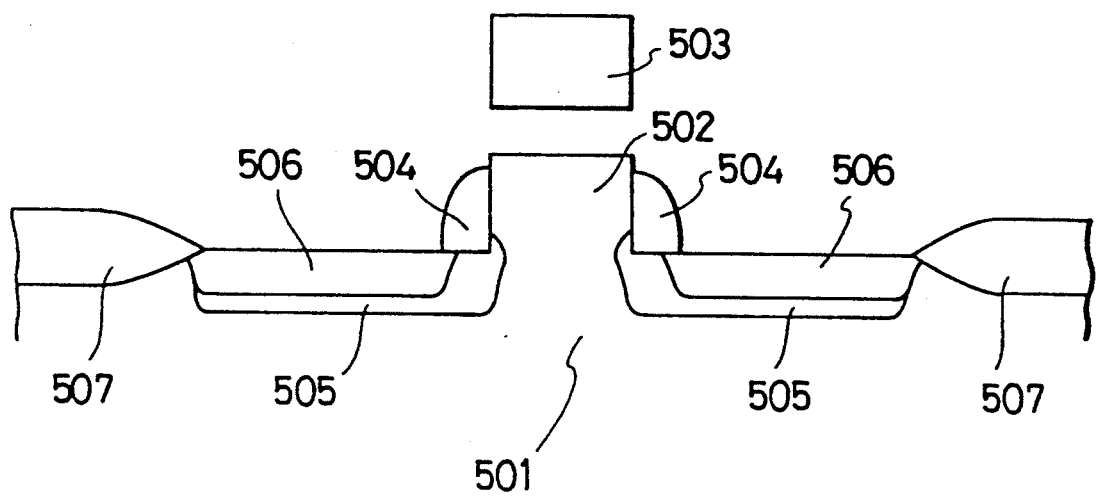
FIG. 5 is a cross sectional view of the structure of a MISFET according to still another embodiment of the present invention.
Figure 6A:
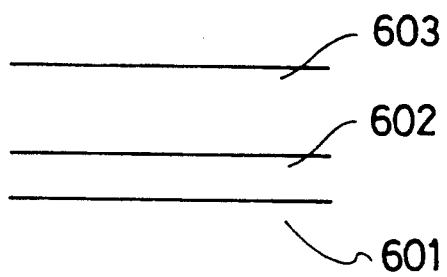
FIGS. 6(a)–6(d) shows schematically a fabrication process of a MISFET according to an embodiment of the present invention.
Figure 6B:
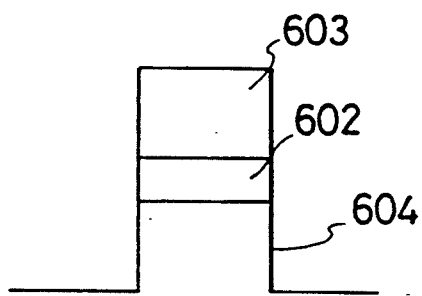

Referring to FIGS. 6(a)–6(d), the process for fabricating a MISFET according to the present invention is described. As shown in FIG. 6(a), on a semiconductor substrate 601 are laminated a thin insulator film 602 and further thereon an electrically conductive film 603 composed of a semiconductor or metallic film. The material and the thickness of the insulator film 602 and the electrically conductive film 603 must be selected properly since a part of each of the films should function later as a gate insulator film and a gate electrode, respectively. Typically, the insulator film 602 is made of, for example, silicon oxide, silicon nitride, phosphosilicate glass, borosilicate glass, aluminum oxide, diamond, amorphous carbon, and laminated films thereof as well as mixed films thereof, at a thickness of from 2 to 100 nm. The electrically conductive film 603 is typically made of semiconductor materials (such as silicon, germanium, and gallium arsenide), metals or alloys (such as molybdenum and tungsten), silicides (such as molybdenum silicide and tungsten silicide), and carbides (such as molybdenum carbide and tungsten carbide), at a thickness of from 10 nm to 10 μm. The electrically conductive film 603 may have further laminated thereon a film of another metal or semiconductor. The electrically conductive film 603 and the insulator film 602 are then removed by a known anisotropic etching, leaving out the portion to establish later a gate electrode. Also a part of the semiconductor substrate 601 is then removed. The semiconductor substrate 601 is etched here typically to a depth of from 10 nm to 1 μm, however, this depth is not definite but depends on the size of the semiconductor to be provided later on the side thereof and also on the scale of the MISFET device as a whole. The etching must be conducted vertically to the substrate. In other words, it is requisite that the face 604 which results from the etching make a right angle, or approximately a right angle, with respect to the substrate. Thus is obtained a structure as shown in FIG. 6(b).

Figure 6C:
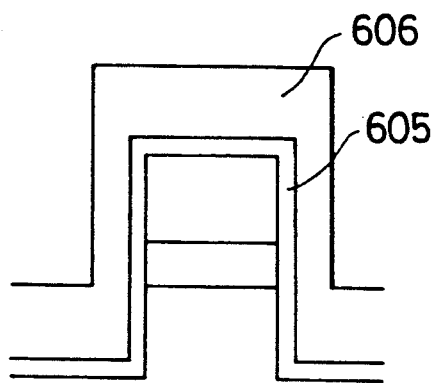

An insulator film 605 is then formed on the whole structure by chemical vapor deposition (CVD), thermal oxidation, or thermal nitridation, to a thickness which allows the generation of a tunnel current. Further thereon is provided an electrically conductive film 606 comprising a metal or a semiconductor, by a CVD process or the like, to thereby obtain a structure as shown in FIG. 6(c).

Figure 6D:
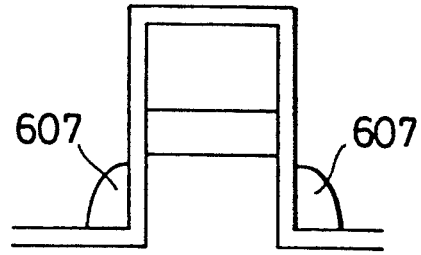

Finally, the electrically conductive film 606 is partly removed by a known anisotropic etching method, to thereby leave over therefrom a portion 607 on the side of the plateau-like portion on the semiconductor substrate. The material for the insulator film 605 should be selected from those materials which are not removed by the etching process. Thus is finally obtained the structure as shown in FIG. 6(d).

Process 2

Figures 7A, 7B:
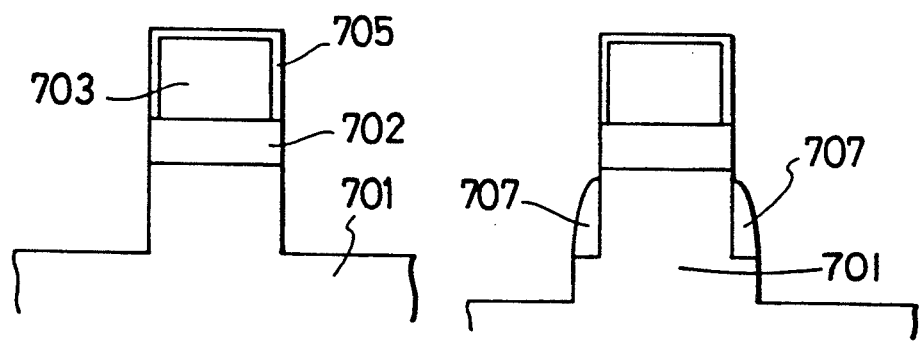
FIGS. 7(a)–7(b) shows schematically a fabrication process of a MISFET according to another embodiment of the present invention.

Referring to FIGS. 7(a)–7(b), the process for fabricating another MISFET according to the present invention is described. In the same procedure as described in Process 1, on a semiconductor substrate 701 are laminated a thin insulator film 702 and further thereon an electrically conductive film 703 composed of a semiconductor or metallic film. Again in the same manner as in Process 1, a known anisotropic etching method is applied to remove the semiconductor film 703 alone by etching. Then, on the surface or the upper face of the portion thus obtained by etching, which becomes later a gate electrode, is provided selectively an insulator film 705, such as of silicon nitride, by thermal nitridation or the like. The anisotropic etching is again continued thereafter as in Process 1 to obtain a plateau-like portion on the semiconductor substrate, having provided thereon a gate insulator film and a gate electrode. In this manner is obtained a structure shown in FIG. 7(a).

An electrically conductive film comprising a metal or a semiconductor is deposited over the whole structure, which is then anisotropically etched in the same manner as in Process 1 to obtain a conductive region 707. Again in this step, it is required that the insulator film 705 is not removed by the etching of the electrically conductive film. Furthermore, in the case the substrate is made of the same material as that of the electrically conductive film, as shown in FIG. 7(b), there may occur etching of the substrate. Thus is obtained a structure as shown in FIG. 7(b).

Process 3

Figures 8A, 8B:
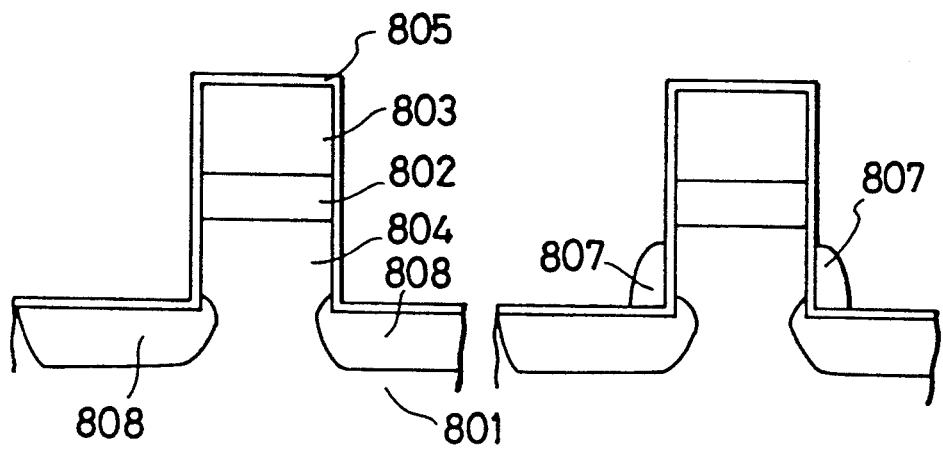
FIGS. 8(a)–8(b) shows schematically a fabrication process of a MISFET according to another embodiment of the present invention.

Referring to FIGS. 8(a)-8(b), the process for fabricating another MISFET according to the present invention is described. In the same procedure and using the same materials as described in Process 1, on a semiconductor substrate 801 are laminated an insulator film and further thereon a semiconductor or metallic film. Again in the same manner as in Process 1, a known anisotropic etching method is applied to provide a plateau-like portion 804 on the semiconductor substrate, having provided thereon a gate insulator film 802 and a gate electrode 803. Then, by applying a known impurity diffusion technique, an impurity region 808 is established selectively using the gate electrode 803 as the mask. An insulator film 805 is then deposited over the surface in the same manner as in Process 1 to obtain a structure shown in FIG. 8(a). After depositing further a semiconductor or a metal film as the electrically conductive film over the structure, an anisotropic etching is conducted in the same manner as in Process 1 to leave over the electrically conductive film 807, to obtain finally a structure as shown in FIG. 8(b).

(Process 4)

Figures 9A, 9B:
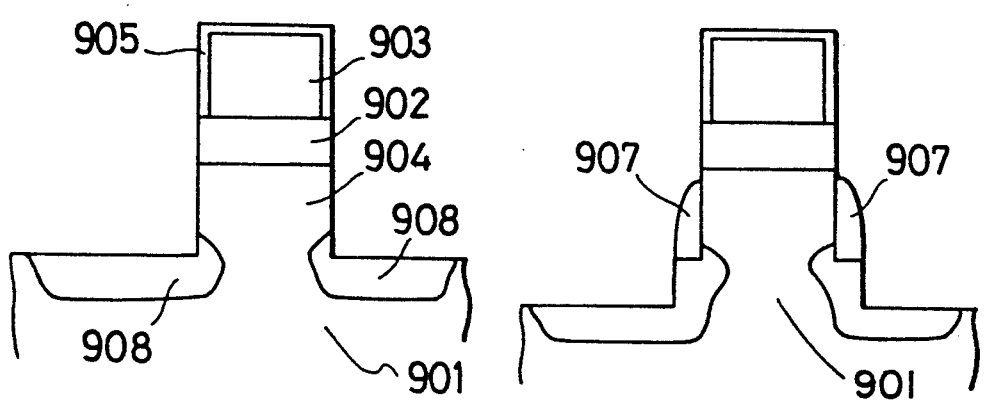
FIGS. 9(a)–9(b) shows schematically a fabrication process of a MISFET according to another embodiment of the present invention.

Referring to FIGS. 9(a)-9(b), the process for fabricating another MISFET according to the present invention is described. In the same procedure and using the same materials as described in Process 2, on a semiconductor substrate 901 are laminated an insulator film and further thereon a semiconductor or metallic film. Again in the same manner as in Process 2, a known anisotropic etching is applied to provide a plateau-like portion 904 on the semiconductor substrate, having provided thereon a gate insulator film 902, and further thereon a gate electrode 903 having an insulator film 905 on the surface or on the upper face thereof. Then, by applying a known impurity diffusion technique, an impurity region 908 is established selectively using the gate electrode 903 as the mask. Thus is obtained a structure shown in FIG. 9(a). After depositing further a semiconductor or a metal film as the electrically conductive film over the structure, an anisotropic etching is conducted in the same manner as in Process 2 to leave over the electrically conductive film 907, to obtain finally a structure as shown in FIG. 9(b).

Process 5

Figures 10A, 10B:
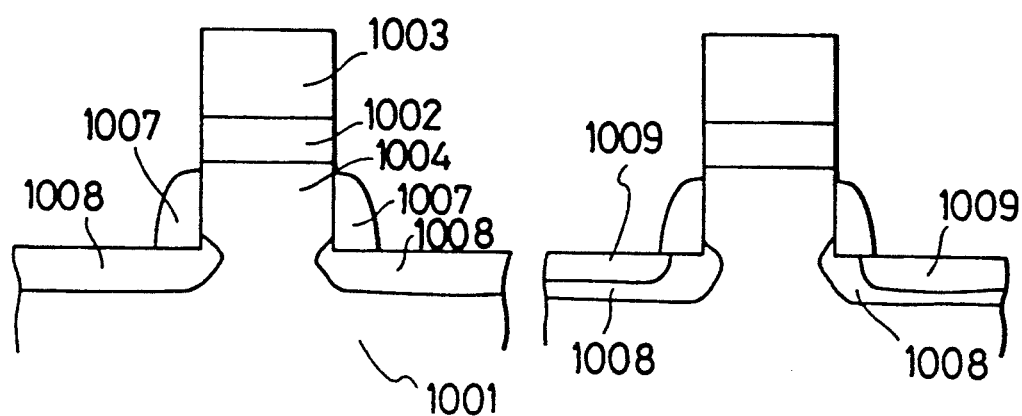
FIGS. 10(a)–10(b) shows schematically a fabrication process of a MISFET according to another embodiment of the present invention.

Referring to FIGS. 10(a)-10(b), the process for fabricating another MISFET according to the present invention is described. In the same procedure and using the same materials as described in Process 3 or 4, on a semiconductor substrate 1001 are provided a plateau-like elevated portion having an insulator film 1002 and further thereon a gate electrode 1003. Further on the side of said plateau-like elevated portion 1004 are formed an electrically conductive region 1007 and further thereunder an impurity region 1008 having a conductive type reverse to that of the substrate. The electrically conductive region 1007 provided in this structure is made of a semiconductor having a conductive type reverse to that of the substrate, i.e., a type which is the same as that of the impurity region 1008 provided thereunder, and, the conductivity of this region 1007 is smaller than that of the impurity region 1008. The resulting structure is shown in FIG. 10(a).

The diffusion of the impurity is again conducted using the gate electrode 1003 and the semiconductor region 1007 as the mask, whereby an impurity-diffused semiconductor region 1007 is established. At the same time, an impurity region 1009 is also provided inside the impurity region 1008, said region 1009 having a larger impurity concentration and a smaller resistance as compared with those of the impurity region 1008. Thus is obtained finally a structure as shown in FIG. 10(b).

Process 6

Figure 11A:
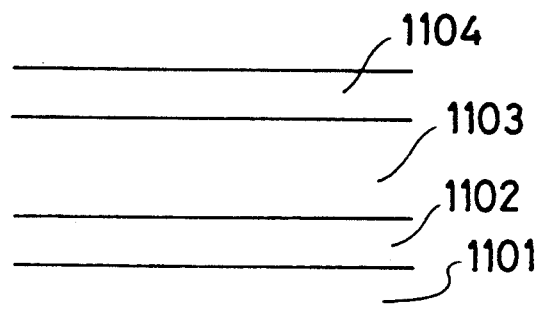
FIGS. 11(a)–11(d) shows schematically a fabrication process of a MISFET according to another embodiment of the present invention.
Figure 11B:
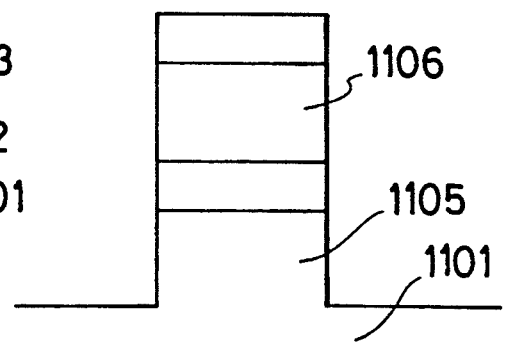
Figure 11C:
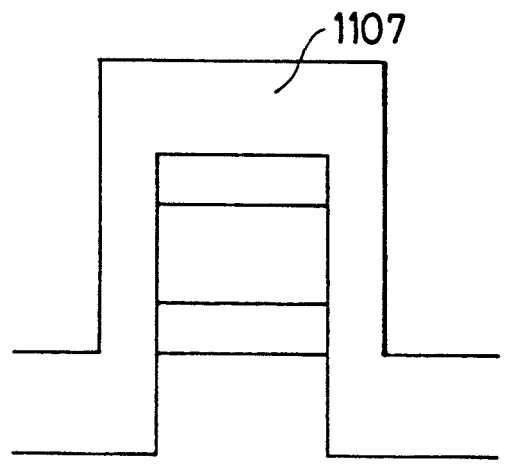
Figure 11D:
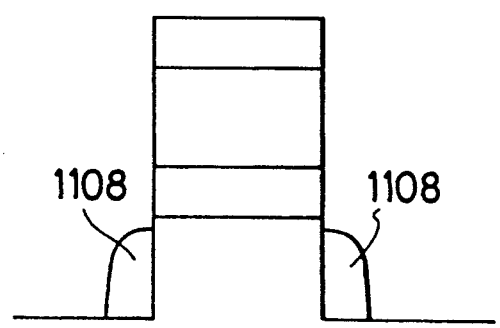

Referring to FIGS. 11(a)-11(d), the process for fabricating another MISFET according to the present invention is described. On a semiconductor substrate 1101 are provided subsequently in this order, an insulator film 1102 from which a gate insulator film is formed later, a semiconductor or metal film 1103 from which a gate electrode is formed later, and a corrosion resistant film 1104 (made of either an insulator or a metal) which resists against etching in the later steps. The resulting structure is shown in FIG. 11(a). Then, anisotropic etching is conducted to remove a part each of the corrosion resistant film 1104, the semiconductor or metal film 1103, the insulator film 1102, and the semiconductor substrate 1101, to thereby obtain a structure comprising a semiconductor substrate having a plateau-like elevated portion 1105 thereon and a gate electrode 1106 further thereon. The etching method for use in this step should be selected so that the corrosion resistant film 1104 may be sufficiently etched. Thus can be obtained the structure as shown in FIG. 11(b). The structure shown in FIG. 11(b) is then wholly coated with an electrically conductive film 1107 made of a semiconductor or a metal, thus resulting in a structure shown in FIG. 11(c). Finally, by an etching process similar to that described in Process 1, the electrically conductive film 1107 is etched to thereby leave over an electrically conductive region 1108. The etching method to be used in this step should be carefully selected so that the corrosion-resistant film 1103 may not be etched. Thus is finally obtained a structure shown in FIG. 11(d).

Process 7

Figure 12A:
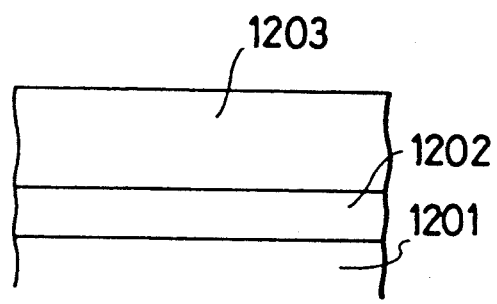
FIGS. 12(a)–12(d) shows schematically a fabrication process of a MISFET according to another embodiment of the present invention.
Figure 12B:
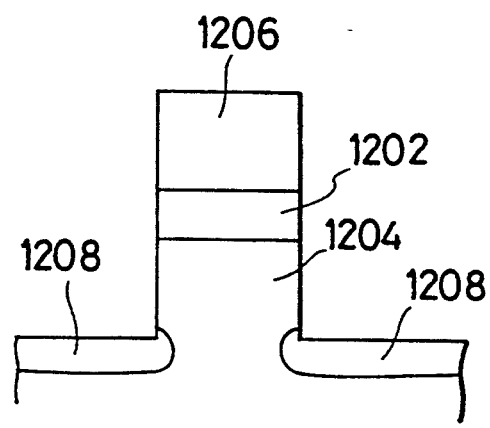
Figure 12C:
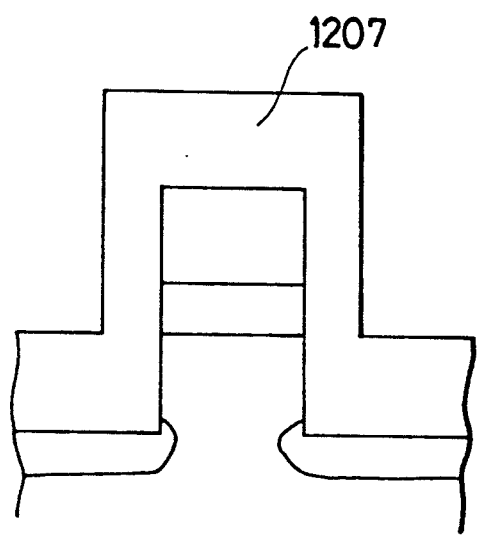
Figure 12D:
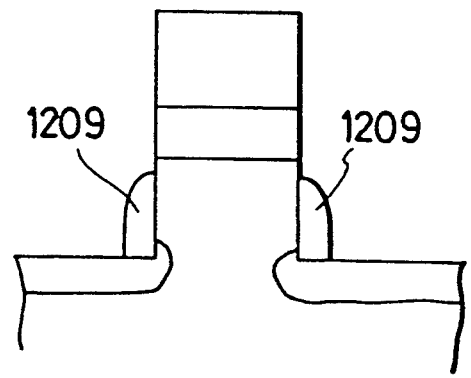

Referring to FIGS. 12(a)-12(d), the process for fabricating another MISFET according to the present invention is described. On a semiconductor substrate 1201 are provided, subsequently in this order, an insulator film 1202 from which a gate insulator film is formed later, and a semiconductor or metal film 1203 from which a gate electrode is formed later (see FIG. 12(a)). Then, anisotropic etching is conducted to remove a part each of the semiconductor or metal film 1203, the insulator film 1202, and the semiconductor substrate 1201, to thereby obtain a structure comprising a semiconductor substrate having a plateau-like elevated portion 1205 thereon with a gate electrode 1206 provided further thereon. Then the impurity is diffused into the substrate using the gate electrode 1206 as the mask, to thereby obtain an impurity region 1208, resulting in a structure as shown in FIG. 12(b). The structure shown in FIG. 12(b) is then wholly coated with an electrically conductive film 1207 made of a semiconductor or a metal, but of a material different from that used as the electrically conductive film 1203, to obtain a structure shown in FIG. 12(c). Finally, by an etching process similar to that described in Process 1, the electrically conductive film 1207 is etched to thereby leave over an electrically conductive region 1209. The etching method to be used in this step should be carefully selected so that the electrically conductive film 1203 may not be etched at the etching of the electrically conductive film 1204. Thus is finally obtained a structure shown in FIG. 12(d).

It can be seen from the foregoing that the MISFETs according to the present invention can be fabricated by various non-limiting methods. The methods above may be combined with each other or with other known processes to provide a wide variety of MISFETs.

The present invention is described in further detail referring to EXAMPLES hereinafter. It should be understood, however, that the present invention is not to be construed as being limited thereto.

EXAMPLE 1

Referring to FIGS. 13(a)–13(g) a process for fabricating a MISFET according to the present invention is described below. On a (100) plane of a p-type single crystal silicon substrate 1301 having a resistivity of 10 Ω·cm were deposited by reduced pressure CVD, first a 30 nm thick silicon oxide film 1302 and further thereon a 100 nm thick silicon nitride film 1303. After applying a photoresist 1304 to the surface of the resulting structure and exposing resist-coated structure to light, dry etching was conducted to selectively remove the photoresist and then the silicon nitride film as well as the underlying silicon oxide film, corresponding to the removed photoresist. Thus is obtained the structure shown in FIG. 10(a).

To the substrate 1301 is then implanted ions of boron using the photoresist as the mask, to thereby obtain a p-type region 1306 containing boron at a high concentration, i.e., at a boron dose of about $10^{13}$ ions per square centimeter. The portion having deprived of the silicon nitride film is then oxidized by a hydrochloric acid oxidation or a wet oxidation to thereby form a thick silicon oxide film 1305, to a thickness of about 800 nm. Thus results a structure as shown in FIG. 10(b).

The previously established silicon oxide film 1302 and the silicon nitride film 1303 are then removed to expose the surface of the substrate 1301 to air. The surface of the substrate thus exposed is oxidized by a dry process to obtain a 15 nm thick silicon oxide film 1307. The substrate is then bombarded with boron ions over the silicon oxide film at a dose of about $10^{12}$ boron ions/cm$^2$, to dope the vicinity of the surface with boron ions. As a result, a p-type region high in boron can be obtained as indicated with numeral 1308 in FIG. 10(c).

A 300 nm thick polycrystalline silicon film is then deposited on the resulting structure by a known reduced pressure CVD. To improve the electric conductivity of the polycrystalline silicon film thus deposited, phosphorus is added at a concentration of about $10^{21}$ atoms/cm$^3$. By coating the polycrystalline silicon film with a photoresist and applying a known lithographic process and a known anisotropic etching, a part each of the polycrystalline silicon film together with the silicon oxide film 1307 and the substrate 1301, respectively, can be removed. The anisotropic etching in this case is effected in a plane-parallel plate reaction cell, by a process which comprises: mounting the substrate on the surface of one of the plates with the face to be etched being exposed, introducing hydrogen gas (pressure: 200 mTorr) containing carbon tetrachloride or carbon tetrafluoride into the cell, and applying a power at a high frequency of 13.56 MHz between the electrodes to thereby generate a plasma inside the cell. It is requisite in this case that a negative voltage is applied to the electrode on which the substrate is mounted. In this manner the polycrystalline silicon film is etched at first.

Figure 13A:
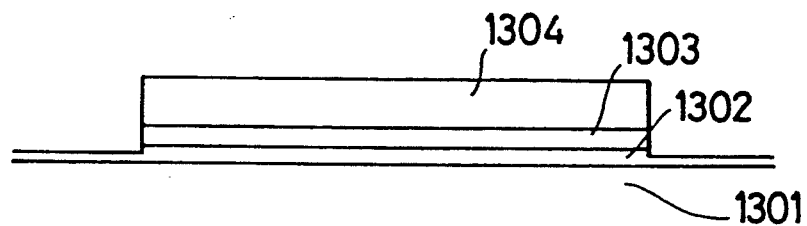
FIGS. 13(a)–13(g) shows schematically a fabrication process of a MISFET according to another embodiment of the present invention.
Figure 13B:
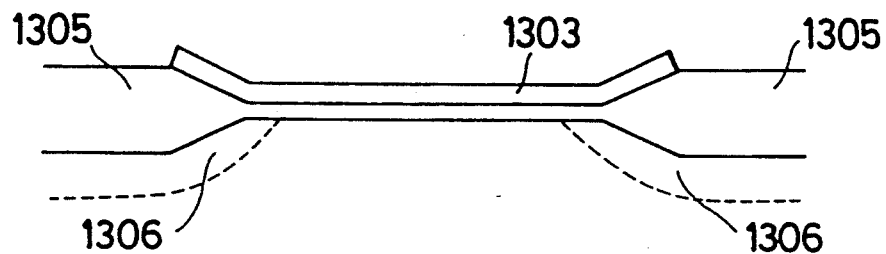
Figure 13C:
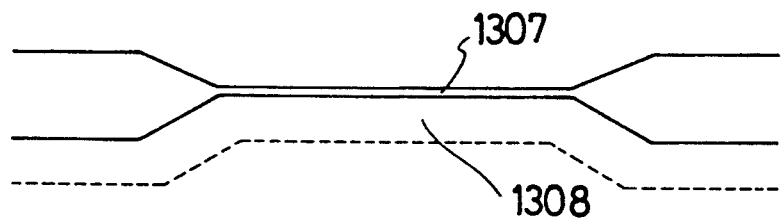
Figure 13D:
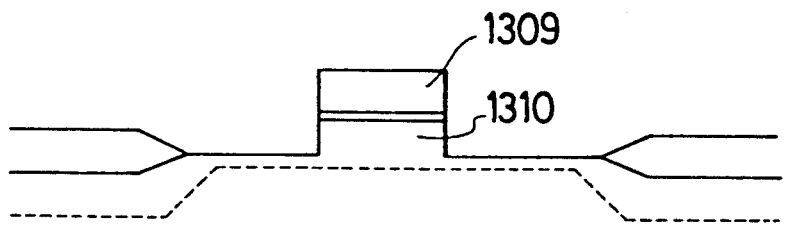

After the polycrystalline silicon film is etched, the high frequency voltage is turned off, the gas inside the cell is evacuated, and a hydrogen gas (pressure: 200 mTorr) containing carbon tetrafluoride is newly introduced into the cell to selectively etch the silicon oxide film 207 this time in the same manner as above. After the etching of the silicon oxide film 1307 is completed, the gas inside the cell is evacuated, and again a hydrogen gas (pressure: 200 mTorr) containing carbon tetrafluoride or carbon tetrachloride is supplied to the cell to carry out the selective etching of the substrate 1301 in the same manner as in the etching of the foregoing two films. The etching is completed at the point the etching depth reaches 500 nm. By conducting the process steps above, an elevated portion 1310 having provided on the surface thereof a gate electrode 1309 can be established on the surface of the substrate. Thus is provided a structure as shown in FIG. 13(d), having a 500 nm wide gate electrode (channel length).

Figure 13E:
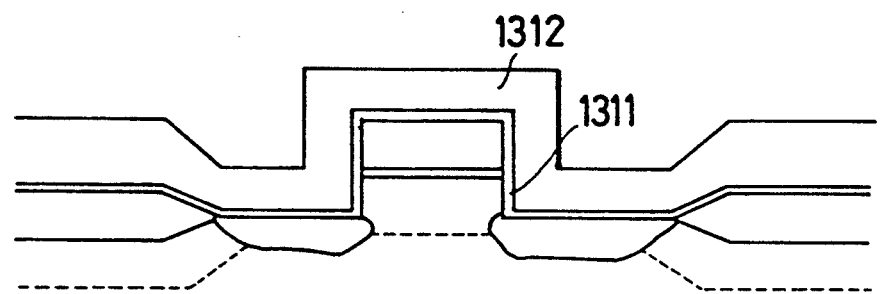
Figure 13F:
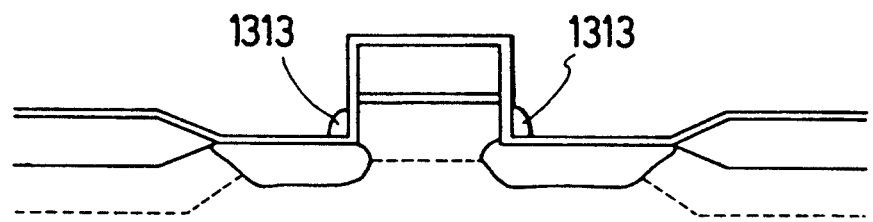

Then, the substrate is further bombarded with arsenic ions at a dose of about $10^{16}$ ions/cm$^2$ using the gate electrode 1309 as the mask. The thus impurity-doped structure is subjected to thermal diffusion treatment, by annealing at 1100° C. for 60 minutes. Further thereon is provided about 4 nm thick silicon nitride film 1311 by heating the structure at 1200° C. for one hour in ammonia gas under a pressure of 1 atm. Then, about 200 nm thick polycrystalline silicon film 1312 is formed over the structure by thermal CVD using silane as the raw material gas. The resulting structure is shown in FIG. 13(e).

The polycrystalline silicon film 1312 is etched by anisotropic etching to thereby leave out the polycrystalline silicon 1313 only on the side of the elevated portion of the substrate. Thus is obtained a structure shown in FIG. 13(f).

Figure 13G:
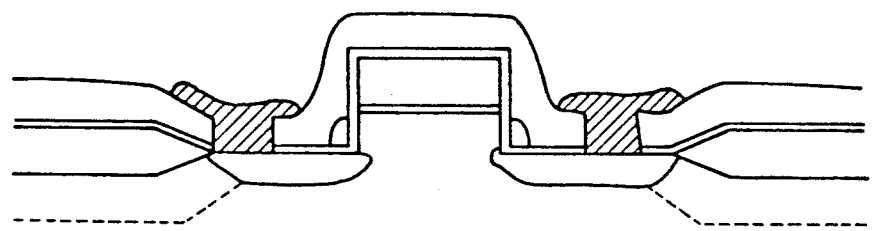

Then, on the surface is deposited phosphosilicate glass (PSG) at a thickness of about 500 nm. As a final step, the PSG is perforated by a known etching technique to provide holes for the electrodes, coated with an aluminum film which is then removed selectively, and furnished with source and drain electrode 1315. Thus is finished into a MISFET according to the present invention, whose structure is shown in FIG. 13(g).

EXAMPLE 2

Referring to FIGS. 14(a)–14(d), a process for fabricating another MISFET according to the present invention is described. In the same manner as in Example 1, a field insulator 1402 and a 15 nm thick thermal silicon oxide 1403 are formed on the surface of a p-type silicon substrate. Similarly, a p-type region containing boron at a high concentration is established at the vicinity of the surface of the substrate. A polycrystalline silicon film is then deposited over the whole substrate. The resulting substrate is then mounted on the plate inside the same plane-parallel plate type anisotropic etching apparatus described in Example 1, to thereby form a gate electrode 1404 by etching the polycrystalline silicon film alone, using the discharge in hydrogen gas in the presence of carbon tetrachloride. The resulting structure is heated in nitrogen under a pressure of 1 atm. at 1250° C. for 1 hour, to thereby deposit about 3 nm thick silicon nitride film 1405 on the surface of the gate electrode. Thus is obtained a structure illustrated in FIG. 14(a).

The substrate is then mounted again in the plane-parallel plate type etching apparatus described above, to thereby etch the silicon oxide film 1403 and the substrate 1401 using the gate electrode 1404. The etching is completed at the point the etching depth reaches 500 nm. By conducting the process steps above, an elevated portion 1407 having provided on the surface thereof a gate electrode 1404 can be established on substrate. Thus is provided a structure as shown in FIG. 14(b), having a 500 nm wide gate electrode (channel length).

Then, the substrate is further bombarded with arsenic ions at a dose of about $10^{15}$ ions/cm$^2$ using the gate electrode 1404 as the mask. The thus impurity-doped structure is subjected to thermal diffusion treatment to establish an impurity region 1409, by annealing at 1100° C. for 60 minutes. Then, about 200 nm thick polycrystalline silicon film having incorporated therein phosphorus as the p-type impurity at an amount of $10^{14}$ cm$^{-2}$ is formed over the structure by thermal CVD using silane as the raw material gas. The thus deposited polycrystalline silicon film is subjected to anisotropic etching to leave over the polycrystalline silicon 1408 on the side of the elevated portion established on the substrate. The resulting structure is shown in FIG. 14(c).

The substrate is further bombarded with arsenic ions at a dose of about $10^{16}$ ions/cm$^2$ using the gate electrode 1404, the polycrystalline silicon 1408, and the field oxide 1402 as the masks. The thus impurity-doped structure is subjected to thermal diffusion treatment by annealing at 1100° C. for 60 minutes, to thereby establish an n-type impurity region 1410 having a higher conductivity inside the impurity region 1409. At the same time, the impurities are thermally diffused into the polycrystalline silicon 1408 to thereby convert it from the weak p-type into a weak n-type. Thus is fabricated a MISFET according to the present invention, whose structure is shown in FIG. 14(d).

EXAMPLE 3

Referring to FIGS. 15(a)–15(b), a process for fabricating another MISFET according to the present invention is described. In the same manner as in Example 1, a field insulator 1502 is formed on the surface of a p-type silicon substrate. Similarly, a p-type region containing boron at a high concentration is established at the vicinity of the surface of the substrate. The structure in this example is different from those of Examples 1 and 2, and is characterized by that said p-type region has a low concentration at the vicinity of the surface and a high concentration area inside said region. Thus, there is obtained a structure shown in FIG. 15(a). Then, the surface of the silicon substrate is thermally oxidized to establish a 150 nm thick silicon oxide film, and a polycrystalline silicon film is deposited over the whole substrate. The resulting substrate is then subjected to the same process as in Example 2, which comprises steps of film deposition, etching, and impurity diffusion. Thus is obtained a structure as shown in FIG. 15(b), comprising a semiconductor substrate included therein an n+-type impurity region 1509, having provided thereon an elevated plateau-like portion 1507, a polycrystalline silicon gate electrode 1505 whose surface is covered with a silicon nitride film 1506 and which is established on the surface of the plateau-like portion 1507, a gate insulator film 1504 provided right under the gate electrode, and an n+-type polycrystalline silicon region established on the side of the plateau-like portion 1507.

In the same process as in Example 1, the structure thus obtained are furnished with source and drain electrode to thereby finish into a MISFET according to the present invention. In FIG. 15(c) is provided an enlarged view of the portion at the vicinity of the gate electrode of the MISFET thus fabricated. In the MISFET thus obtained, the elevated portion on the silicon substrate contains low boron at the vicinity of the gate insulator film and deep inside the substrate, attaining a maximum boron concentration therebetween. Thus, although the sandwich structure comprising a p-type silicon being incorporated between n+-type silicon appears uniform in FIG. 15(c), the physical and electronic properties of the portion along the line A—A' are much differed from those of the portion along the line B—B'. This difference can be seen clearly in the band profile shown in FIGS. 15(d) and 15(e). The intermediate p-type semiconductor functions more alike an intrinsic semiconductor in the portion along the line A—A' as compared with the portion along the line B—B'. Thus, in the portion along the line A—A', the p-type semiconductor incorporated between the n+-type semiconductors converts from the p-type to an n-type at a low voltage to allow the electric current flow between the n+-type semiconductor regions. On the other hand, the intermediate semiconductor in the portion along the line B—B' is a strong p-type, and, moreover, this portion is farther from the gate electrode. Thus, a high voltage should be applied to convert from the p-type into an n-type. Accordingly, in practice, the current flows via A—A'. The n-type silicon 1508 and the n-type impurity region 1509 in this example are provided at the same impurity concentration, however, even though the n-type silicon 1508 were to be provided at an impurity concentration lower than that of the n-type impurity region 1509, the current flows mainly along the line A—A'. In such a case, the MISFET functions substantially the same as a so-called LDD-type MISFET, since the current flows from an n+-type impurity region 1509 to an n−-type n-type silicon 1508, then through the p-type plateau-like portion 1507 and the other n−-type n-type silicon 1508, to the other n+-type impurity region 1509. In other words, the present invention provides in such a case, a device equivalent to an LDD-type MISFET. However, as can be seen from the Figures, the device according to the present invention is advantageous, since the overlap between the gate electrode and the source of drain is smaller as compared with a conventional LDD-type MISFET; moreover, the device of the present invention can be produced by a simpler process.

The present invention provides a MISFET of a simplified structure having a high reliability and durability; even in a device of the simplest structure according to the invention, the reliability and durability are well comparable or even superior to those of the conventional LDD-type MISFETs. As a matter of course, the MISFETs according to the present invention is far superior in reliability and durability to the conventional MISFETs other than those of the LDD-type. Furthermore, as it can be clearly seen from the descriptions in the Examples and the like, the simplest MISFET of the present invention can be fabricated by a process and a number of masks equivalent to those employed in the fabrication of the conventional MISFETs other than those of the LDD-type. A MISFET of the present invention far improved in properties can be obtained by taking a more complicated fabrication process. Thus, it is obvious to one skilled in the art that the present invention is useful for the industry.

While the invention has been described in detail and with reference to specific embodiments thereof, it will be apparent to one skilled in the art that various changes and modifications can be made therein without departing from the spirit and scope thereof. An example of such modifications is as follows.

Referring to FIG. 10, the process for fabricating another MISFET according to the present invention is described. In the same procedure and using the same materials as described in Process 3 or 4, on a semiconductor substrate 1001 are provided a plateau-like elevated portion having an insulator film 1002 and further thereon a gate electrode 1003. Further on the side of said plateau-like elevated portion 1004 are formed an electrically conductive portion 1007 and further thereunder an impurity region 1008 having a conductivity type opposite to that of the substrate. The electrically conductive region 1007 provided in this structure is made of a semiconductor having the same conductivity type as the substrate, i.e., a type which is opposite to that of the impurity region 1008 provided thereunder. The resulting structure is shown in FIG. 10(a).

The diffusion of the impurity is again conducted using the gate electrode 1003 and the semiconductor region 1007 as the mask, whereby an impurity-diffused semiconductor region 1007 having a conductivity type opposite to that of the substrate is established. At the same time, an impurity region 1009 is also provided inside the impurity region 1008, said region 1009 having a larger impurity concentration and a smaller resistance as compared with those of the impurity region 1008. Thus is obtained finally a structure as shown in FIG. 10(b).

What is claimed is:

1. An insulated gate field effect semiconductor device comprising:
    a semiconductor substrate having a protrusion at a surface of said semiconductor substrate;
    a gate electrode provided on said protrusion with a gate insulating film therebetween;
    a conductive substance provided on a side surface of said protrusion with an upper surface of said conductive substance not higher than an upper surface of said protrusion;
    an insulating layer located between said conductive substance and said side surface of said protrusion; and
    a channel located in said protrusion of the semiconductor substrate under said gate insulating film,
    wherein said conductive substance functions as source or drain regions of said semiconductor device.

2. The device of claim 1 wherein said conductive substance comprises a semiconductor.

3. The device of claim 2 wherein said conductive substance is doped with an element selected from Group III and Group V of the Periodic Table.

4. The device of claim 1 wherein said conductive substance comprises a metal.

5. The device of claim 1 wherein said insulating layer comprises silicon nitride.

6. An insulated gate field effect semiconductor device comprising:
    a semiconductor substrate of one conductivity type having a protrusion;
    a gate electrode formed on said protrusion with a gate insulating layer therebetween;
    source and drain regions formed on opposite side faces of said protrusion through an insulating layer therebetween, said insulating layer capable of passing a tunnel current therethrough; and
    a channel region defined between said source and drain regions in said protrusion,
    wherein a height of said source and drain regions is not higher than an upper surface of said protrusion, respectively.

7. An insulated gate field effect semiconductor device comprising:
    a semiconductor substrate having a protrusion at a surface of said semiconductor substrate;
    a gate electrode provided on said protrusion with a gate insulating film therebetween;
    a semiconductor substance of one conductivity type provided on a vertical side surface of said protrusion with an upper surface of said semiconductor substance not higher than an upper surface of said protrusion;
    a region having the same conductivity type as said semiconductor substance in contact with said semiconductor substance; and
    a channel located in said protrusion of the semiconductor substrate under said gate insulating film,
    wherein said semiconductor substance functions as source or drain regions of said semiconductor device.

8. The device of claim 7 further comprising a corrosion resistant film provided at least on an upper surface of said gate electrode.

9. The device of claim 7 wherein said semiconductor substance is in contact with said vertical side surface of said protrusion and an upper surface of said substrate.

10. An insulated gate field effect semiconductor device comprising:
    a semiconductor substrate having a protrusion at a surface of said semiconductor substrate;
    a gate electrode provided on said protrusion with a gate insulating film therebetween;
    a conductive substance provided on a vertical side surface of said protrusion with an upper surface of said conductive substance not higher than an upper surface of said protrusion;
    a conductive region provided in said semiconductor substrate under said conductive substance, said conductive region being doped with an impurity to enhance the conductivity of said conductive region, wherein said conductive region has a smaller conductivity in a portion thereof just under said conductive substance than in the rest of said conductive region; and
    a channel located in said protrusion of the semiconductor substrate under said gate insulating film,
    wherein said conductive substance functions as source or drain regions of said semiconductor device.

11. The device of claim 10 wherein said conductive region is in contact with said conductive substance.

12. An insulated gate field effect semiconductor device comprising:
    a semiconductor substrate of one conductivity type having a protrusion;
    a gate electrode formed on said protrusion with a gate insulating layer therebetween;
    source and drain regions formed on opposite vertical side faces of said protrusion, said source and drain regions comprising a semiconductor of one conductivity type which is opposite to that of said semiconductor substrate; and a channel region defined between said source and drain regions in said protrusion, wherein a height of said source and drain regions is not higher than an upper surface of said protrusion, respectively.

13. The device of claim 12 wherein a pair of impurity regions are formed in said semiconductor substrate, said impurity regions having the same conductivity type as that of said source and drain regions and being connected to corresponding one of said source and drain regions.

* * * * *